(12) United States Patent
Chien

(10) Patent No.: US 7,236,062 B2
(45) Date of Patent: Jun. 26, 2007

(54) LOW PHASE NOISE CRYSTAL OSCILLATOR WITH SUPPLY NOISE FILTERING

(75) Inventor: Hung-Ming Chien, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 179 days.

(21) Appl. No.: 11/084,941

(22) Filed: Mar. 21, 2005

(65) Prior Publication Data
US 2006/0208814 A1    Sep. 21, 2006

(51) Int. Cl.
H03B 5/32    (2006.01)

(52) U.S. Cl. .............................. 331/158; 331/186

(58) Field of Classification Search ............... 331/158, 331/186, 185
See application file for complete search history.

(56) References Cited

U.S. PATENT DOCUMENTS 5,212,460 A * 5/1993 Tamagawa ............ 331/116 FE
5,546,055 A * 8/1996 Klughart ............... 331/116 FE
6,166,609 A * 12/2000 Nakamiya et al. ........... 331/109
2002/0167367 A1* 11/2002 Ingino ........................ 331/186

* cited by examiner

Primary Examiner—Joseph Chang
(74) Attorney, Agent, or Firm—McAndrews, Held & Malloy, Ltd.

(57) ABSTRACT

A low phase noise crystal oscillator with supply noise filtering is provided and may comprise receiving an input voltage at a positive potential input of an oscillator circuit, which may comprise an oscillator core and a buffer coupled to an output of the oscillator core. Noise caused by the input voltage that may affect the buffer may be filtered using a resistor coupled between the positive potential input of the oscillator circuit and the input voltage, and a capacitor coupled between the positive potential input of the oscillator circuit and a ground of the oscillator circuit. The noise may be filtered via a low pass filter, which may comprise at least the resistor and the capacitor. A cutoff frequency may be selected for the low pass filter, and a resistance value for the resistor and a capacitance value for the capacitor may be selected appropriately.

18 Claims, 6 Drawing Sheets

LOW PHASE NOISE CRYSTAL OSCILLATOR WITH SUPPLY NOISE FILTERING

CROSS-REFERENCE TO RELATED APPLICATIONS/INCORPORATION BY REFERENCE

Not Applicable.

FIELD OF THE INVENTION

Certain embodiments of the invention relate to noise reduction circuitry. More specifically, certain embodiments of the invention relate to a low phase noise crystal oscillator with supply noise filtering.

BACKGROUND OF THE INVENTION

In some conventional communications systems, various signals may need to be generated at particular frequencies. For example, synchronous digital circuits rely on at least one clock signal to provide a reference by which various logical blocks may be synchronized. Typically, a master clock signal may be generated, and other clock signals may be derived from the master clock. The derived clock signals may be generated by dividing the master clock so that the master clock frequency is an integer multiple of each derived clock frequency. Additionally, a radio frequency (RF) front end of a communication system may need intermediate mixing signals to downconvert received RF signals at various carrier frequencies to a local IF signal that may be processed by a single IF processing block. The circuitry used to process a single local IF signal may be simpler, and hence, less expensive, than the circuitry used to process multiple local IF signals.

In order to generate a single local IF signal, the received RF signal may be mixed with an intermediate mixing signal, and the result may be a signal whose frequency is the difference between the received RF signal frequency and the intermediate mixing signal frequency. Therefore, as the RF carrier frequency varies for the different communication channels, the intermediate mixing signal frequency must also change in order to keep the local IF signal frequency constant. A phase locked loop (PLL) oscillator circuit is an example of a circuit that may generate the various intermediate mixing signals.

The PLL oscillator circuit may comprise a voltage controlled oscillator (VCO), a frequency divider, a phase detector, and a reference oscillator. The VCO may generate a signal whose frequency depends on a control voltage generated by the phase detector. The phase detector may generate the control voltage by comparing a reference signal from a reference oscillator to a feedback portion of the VCO output signal. The feedback portion of the VCO output signal may be a feedback signal generated by a frequency divider that divides the frequency of the VCO output signal.

The frequency divider may be communicated a value that may indicate the factor by which to divide a VCO output signal. If the frequencies of the frequency divider output signal and the reference signal are the same, then the voltage output from the phase detector may not indicate any change in the frequency of the VCO output. If the frequency of the VCO output is larger than the reference signal frequency, then the phase detector voltage output may indicate to the VCO to reduce the frequency of the VCO output signal. Similarly, if the frequency of the VCO output is smaller than the reference signal frequency, then the phase detector voltage output may indicate to the VCO to increase the frequency of the VCO output signal. In this manner, the VCO output signal may be kept at a constant, desired frequency value. The VCO may be controlled, not only to keep a constant frequency, but also to change the frequency by changing the value communicated to the frequency divider. The reference oscillator may have a fixed frequency value that may be in the range, for example, of a megahertz to several tens of megahertz.

Various high frequency signals present in a communication system, for example, clock signals generated from a master clock, the feedback signals PLL oscillator circuit, and/or various circuitry that may generate signals, digital and/or analog, may be propagated to other circuits. These signals may cause interference noise to appear on signal paths, and the power and ground paths. The noise propagated on the power paths may interfere with some circuitry. For example, noise on the supply voltage to the oscillator circuitry may affect phase noise characteristics of the oscillator circuit output signal. In effect, the phase noise may introduce jitter to the generated signal.

If the jitter is severe enough, the digital logic circuitry may malfunction. For example, data may require a certain time to propagate from one circuit block to another circuit block. If the jitter reduces the sampling period to less than the propagation delay from one circuit block to another circuit block, erroneous data may be sampled by the receiving logic that may be utilizing the jittery clock signal. Analog circuits may also be affected by signal jitter. The RF receiver may be utilizing the signal with jitter as the intermediate mixing signal. The local IF signal, therefore, may show phase changes due to the jitter. The phase changes may affect data extracted from the local IF signal.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method for a low phase noise crystal oscillator with supply noise filtering, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a low phase noise crystal oscillator with supply noise filtering. Various aspects of the invention may be utilized in circuitry that may need to reduce noise on a power supply voltage to an oscillator circuit. Noise on the oscillator circuit may impart jitter to a generated signal. The jitter may be undesired because it may, for example, lend uncertainty to a period of the generated signal. If the generated signal is used as a clock signal, the jitter in the clock signal may cause logic circuitry to capture wrong data. If the generated signal is used as an intermediate mixing signal to downconvert a received RF signal to a local IF signal, the jitter may cause wrong information to be extracted from the local IF signal.

An embodiment of the invention may comprise a low-pass filter that may be utilized for various circuitry, including integrated circuits that may be designed for wireless communications. The low-pass filter may comprise a resistor and a capacitor that may have suitable frequency response characteristics for removing unwanted noise signals from the voltage communicated to the oscillator circuit. Additionally, the resistor value may be appropriately chosen so as to minimize the voltage drop across the resistor. A voltage drop that may be too large may cause the voltage communicated to the oscillator circuit to be too low, and, therefore, the oscillator circuit may not function effectively, if at all.

Aspects of the invention may comprise receiving an input voltage at a positive potential input of an oscillator circuit, which may comprise an oscillator core and a buffer coupled to an output of the oscillator core. Noise caused by the input voltage that may affect the buffer may be filtered using a resistor coupled between the positive potential input of the oscillator circuit and the input voltage, and a capacitor coupled between the positive potential input of the oscillator circuit and a ground of the oscillator circuit. The noise may be filtered via a low pass filter, which may comprise at least the resistor and the capacitor.

A cutoff frequency may be selected for the low pass filter and a resistance value for the resistor and a capacitance value for the capacitor may be selected for the cutoff frequency. For example, the cutoff frequency may be about one kilohertz. Additionally, a resistance value for the resistor may be selected to maintain at least a minimum voltage for the oscillator circuit. In order to compensate for a voltage drop across the resistor, the input voltage may be varied. The varying of the input voltage may be programmably controlled. The input voltage may also be limited so that it does not exceed a maximum voltage requirement for the oscillator circuit.

Figure 1:
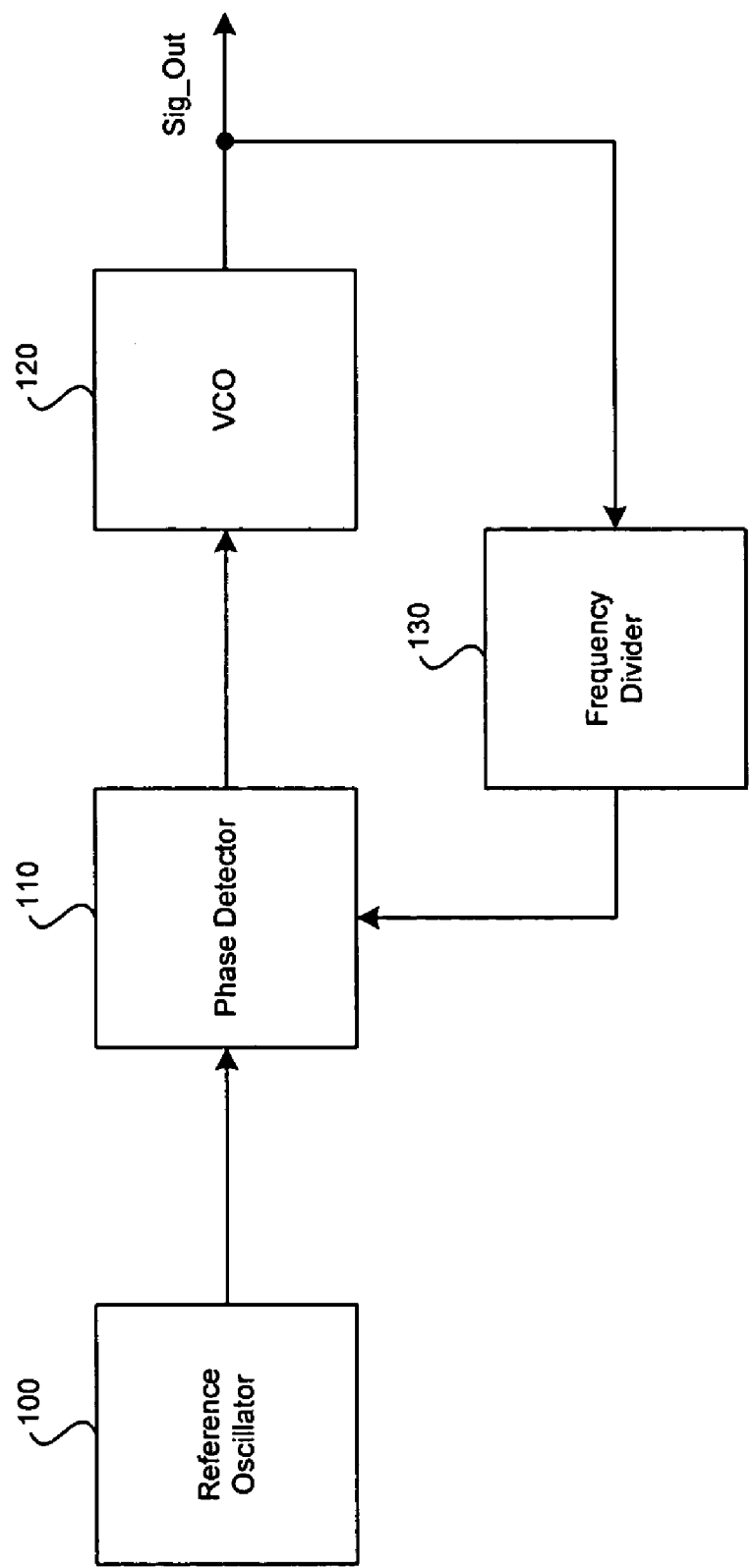
FIG. 1 is a block diagram illustrating an exemplary phase locked loop that may be utilized in connection with an embodiment of the invention.

FIG. 1 is a block diagram illustrating an exemplary phase locked loop that may be utilized in connection with an embodiment of the invention. Referring to FIG. 1, there is shown a reference oscillator 100, a phase detector 110, a voltage controlled oscillator (VCO) 120, and a frequency divider 130.

The reference oscillator 100 may comprise suitable logic and/or circuitry that may be adapted to generate a signal of a fixed frequency. The signal may be utilized as a reference signal for a phased lock loop circuit. This signal may be a low frequency signal on the order of, for example, megahertz or tens of megahertz. The phase detector 110 may comprise suitable logic and/or circuitry that may be adapted to compare two signals and generate an output voltage that may indicate whether the two signals have the same frequency, or whether the frequency of one signal is larger than the frequency of the other signal.

The voltage controlled oscillator 120 may comprise suitable logic and/or circuitry that may be adapted to generate a signal that may vary in frequency according to an input control voltage. The input control voltage may be communicated by the phase detector 110. The voltage controlled oscillator 120 may be utilized to generate intermediate mixing signals that may be utilized to downconvert RF signals to the local IF signal. The local IF signal may be centered about a fixed frequency, and the RF signals may be centered about various RF carrier frequencies. Therefore, the intermediate mixing signals may need to vary as the RF carrier frequencies vary for the different RF channels utilized. A single voltage controlled oscillator 120 may supply the intermediate mixing signal, whose frequency may be changed, to downconvert the various RF signals.

The frequency divider 130 may comprise suitable logic and/or circuitry that may be adapted to reduce the frequency of an input signal, for example, the output signal, Sig_Out, from the voltage controlled oscillator 120, by an integer factor. The output of the frequency divider 130 may be communicated to the phase detector 110. The phase detector 110 may compare the output of the frequency divider 130 and the output of the reference oscillator 100. The phase detector 110 may generate suitable voltage to communicate to the voltage controlled oscillator 120 that may indicate whether to increase the frequency of the output signal, Sig_Out, decrease the frequency of the output signal, Sig_Out, or keep the frequency of the output signal, Sig_Out, at the same frequency.

In operation, the frequency divider 130 may divide the output signal, Sig_Out, from the voltage controlled oscillator 120 by an integer value to generate a signal that may be the same frequency as the reference signal generated by the reference oscillator 100. However, if the output signal, Sig_Out, is not quite a desired integer multiple of the reference signal generated by the reference oscillator 100, or if it is an incorrect integer multiple of the reference signal generated by the reference oscillator 100, the phase detector 110 may generate a control input voltage. The control input voltage may be communicated to the voltage controlled oscillator 120 to drive the frequency of the output signal, Sig_Out, to the desired frequency value.

Figure 2:
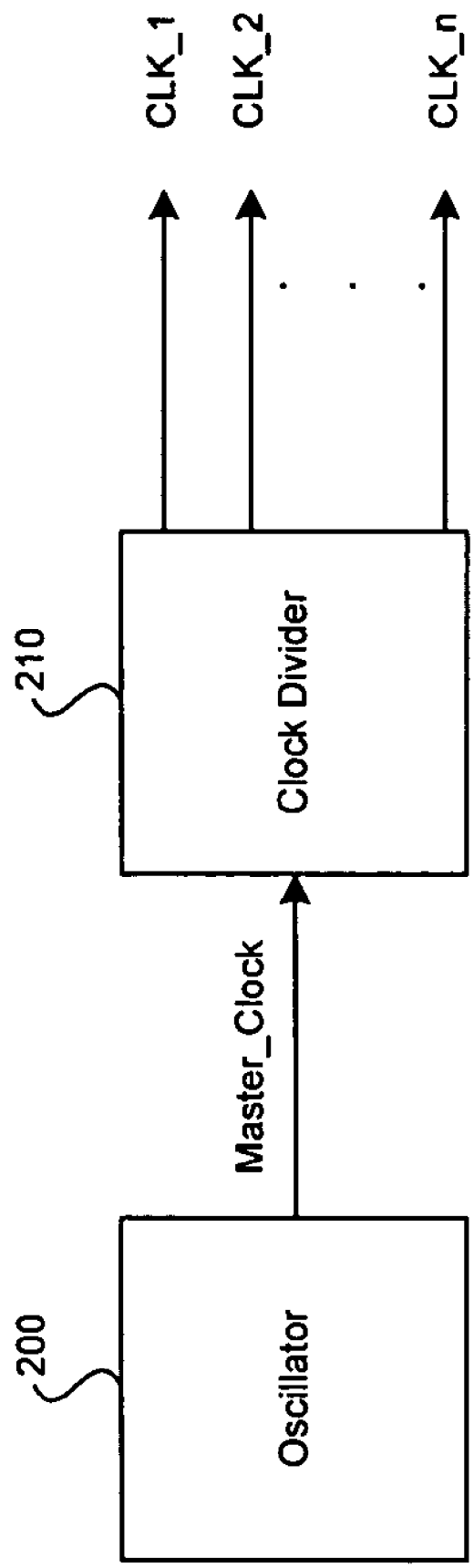
FIG. 2 is a block diagram illustrating an exemplary clock divider circuit that may be utilized in connection with an embodiment of the invention.

FIG. 2 is a block diagram illustrating an exemplary clock divider circuit that may be utilized in connection with an embodiment of the invention. Referring to FIG. 2, there is shown an oscillator block 200 and a clock divider block 210.

The oscillator block 200 may comprise suitable logic and/or circuitry that may be adapted to generate a signal of a fixed frequency. In this manner, the oscillator block 200 may be similar to the reference oscillator 100 (FIG. 1). The output signal of the oscillator block, Master_Clock, may be a clock signal that may be utilized by various digital logic circuitry. The output signal, Master_Clock, may be divided to generate slower frequency clock signals, for example, CLK_1, CLK_2, ..., CLK_n, that may be synchronized to the output signal, Master_Clock.

The clock divider block 210 may comprise suitable logic and/or circuitry that may be adapted to divide a clock signal, for example, the output signal of the oscillator block, Master_Clock, to at least one slower clock signal. For example, the clock divider circuit may generate a plurality of clock signals such as CLK_1, CLK_2, . . . , CLK_n.

In operation, the oscillator block 200 may generate an output signal, Master_Clock, that may be communicated to the clock divider block 210. The clock divider block 210 may divide the output signal from the oscillator block 210, Master_Clock, to generate various lower frequency clock signals, for example, CLK_1, CLK_2, . . . , CLK_n, that may be communicated to various parts of a system. For example, the system may be an integrated circuit or the system may be several chips.

Figure 3:
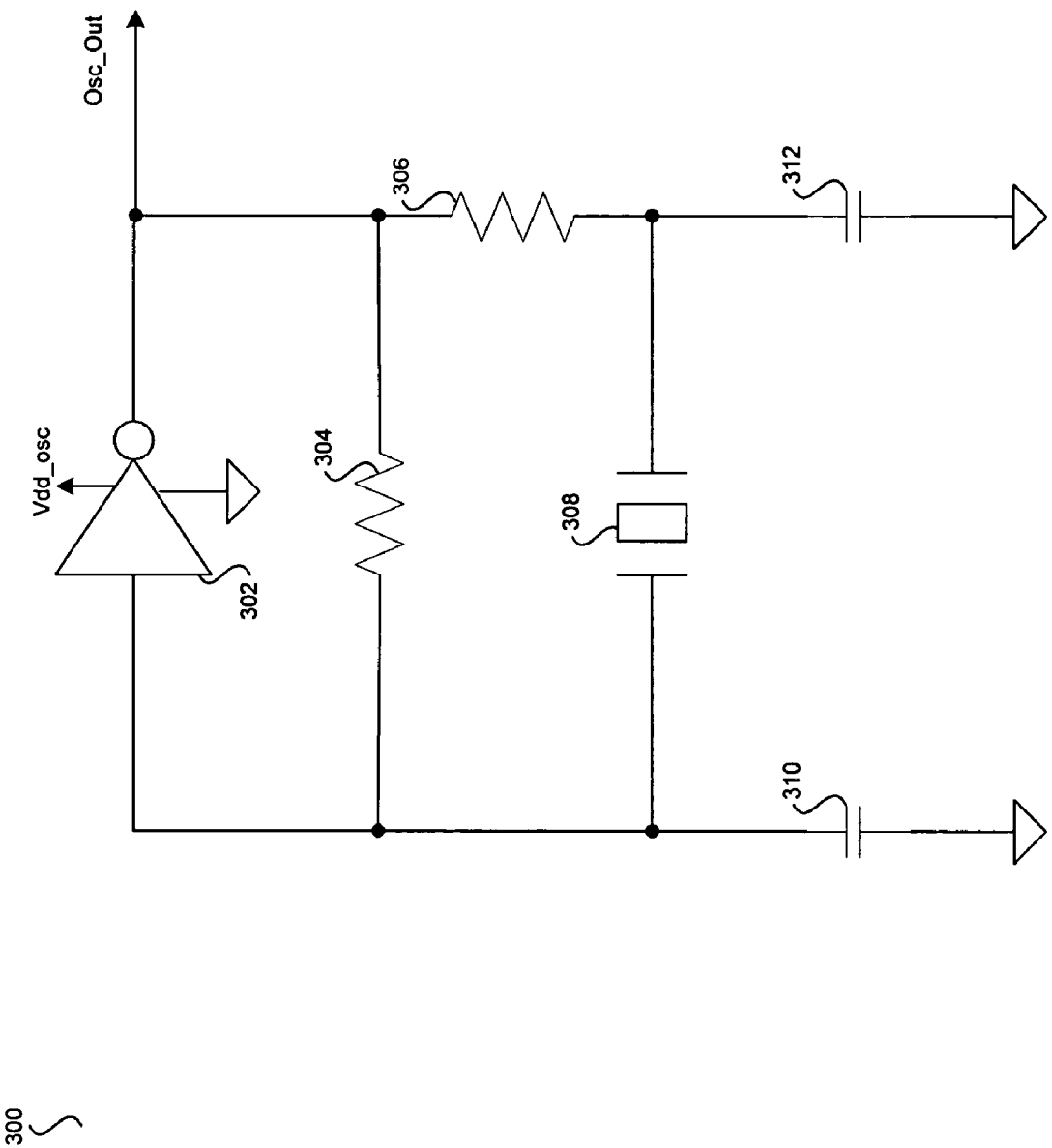
FIG. 3 is a block diagram illustrating an exemplary parallel resonance mode oscillator circuit that may be utilized in connection with an embodiment of the invention.

FIG. 3 is a block diagram illustrating an exemplary parallel resonance mode oscillator circuit that may be utilized in connection with an embodiment of the invention. Referring to FIG. 3, there is shown an oscillator circuit 300 that may comprise an inverting buffer 302, resistors 304 and 306, a quartz crystal 308, and capacitors 310 and 312.

The quartz crystal 308 may typically be composed of silicon-dioxide and may have a resonant frequency that is dependent on the ratio of the crystal's width to its length. The quartz crystal may generate a piezoelectric voltage at its surface when it is physically deformed. Similarly, when a voltage is applied to its surface, the quartz crystal may deform physically. When a quartz crystal is part of an electronic oscillator circuit, the initial power-on voltage may initiate the quartz crystal vibrations. The piezoelectric voltage generated by the vibrations of the quartz crystal may be amplified and fed back to the quartz crystal. The quartz crystal may continue to vibrate at its resonance frequency as long as two conditions are satisfied. One condition that must be met to ensure that a quartz crystal oscillator operates properly is that a closed loop gain must be greater than or equal to one. The second condition is that a phase shift of the closed loop must be $N*(2\pi)$ radians, where N is an integer.

In operation, the inverting buffer 302 may amplify the voltage generated by the quartz crystal 308 and may communicate an inverted signal to the resistor-capacitor network formed by the resistors 304 and 306, and the capacitors 310 and 312. The inverting buffer 302 may provide the necessary gain, and also a phase shift of a little more than 180°, or $\pi$ radians, in the closed loop. The remaining phase shift may be provided by a network formed by the quartz crystal, the resistor 306 and the capacitors 310 and 312. The resistor 306 may function to limit the drive of the inverting buffer 302, so that the quartz crystal 308 may not be overdriven. Overdriving a quartz crystal, for example, the quartz crystal 302, so that it cannot dissipate the power input may damage the quartz crystal.

The output signal of the inverting buffer 302, Osc_Out, may also be the output signal of the oscillator circuit 300. The resistor 304 may be the feedback path for negative feedback to the input of the inverting buffer 302. The value of the feedback resistor may be, for example, in the range of 500 kilo-ohms to two mega-ohms. A manufacturer of the quartz crystal may specify an optimum load capacitance, $C_L$. The load capacitance, $C_L$, may be utilized to set the values of the capacitors 310 and 312 according to the following equation:

$$C_L = C_s + ((C_1 * C_2)/(C_1 + C_2)).$$

The $C_s$ may be a stray capacitance value of the oscillator circuit. A value of 5 picofarads may typically be used for the value of the $C_s$. The $C_1$ and the $C_2$ may be the capacitance values of the capacitors 312 and 310, respectively.

The values of the capacitors 310 and 312 may usually be chosen to be approximately equal to each other. Although either of the capacitors 310 or 312 may be chosen to be large to increase stability, that may decrease the loop gain. Reduced loop gain may cause a problem with start up of the oscillator circuit during power-up. With the values for the capacitors 310 and 312 fixed, the value of the resistor 306 may be specified so that the phase shift provided by the network comprising the resistor 306, the quartz crystal 308, and the capacitors 310 and 312 may be added to the phase shift of the inverting buffer 302 may add up to 360°, or $2\pi$ radians.

Generally, quartz crystals, for example, the quartz crystal 308, may have a high quality (Q) factor. The Q factor for a quartz crystal may depend on the resonance width of the quartz crystal. The resonance width may be the range of possible frequencies over which a quartz crystal may resonate. For example, if the resonance width is one hertz, then the quartz crystal may resonate only if it is within one hertz of its resonance frequency. Therefore, high Q factor quartz crystals may not be affected by external noise. However, a buffer, for example, the inverting buffer 302, or another buffer that may buffer the output of the inverting buffer 302 may be susceptible to noise, for example, noise on a supply voltage line to the buffer.

Figure 4:
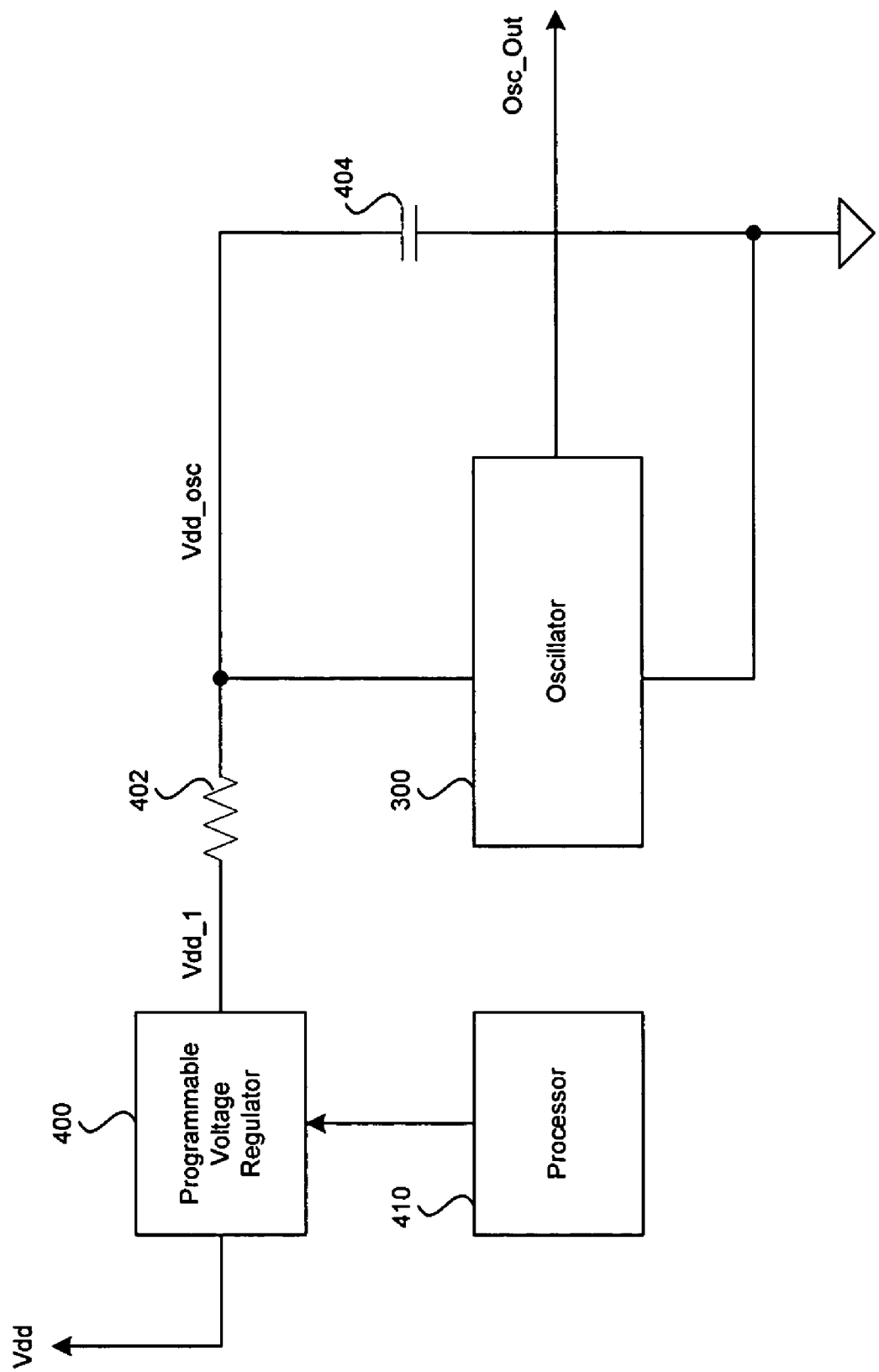
FIG. 4 is a block diagram illustrating an exemplary noise filter, in accordance with an embodiment of the invention.

FIG. 4 is a block diagram illustrating an exemplary noise filter, in accordance with an embodiment of the invention. Referring to FIG. 4, there is shown an oscillator circuit 300, a programmable voltage regulator 400, a resistor 402, a capacitor 404, and a processor 410. The oscillator circuit 300 may be similar to the oscillator circuit 300 (FIG. 3). The programmable voltage regulator 400 may comprise suitable circuitry, logic, and/or code that may be adapted to regulate an input voltage in order to generate an output voltage that may be within desired specifications. For example, the input voltage, Vdd, to the programmable voltage regulator 400 may be higher than the desired output voltage, Vdd_1. The programmable voltage regulator 400 may reduce the voltage of Vdd to generate a suitable voltage, Vdd_1. The programmable voltage regulator 400 may be programmed by an external device, for example, a processor 410, to generate a specific output voltage. A processor 410 may communicate a desired output voltage to the programmable voltage regulator 400. The processor 410 may comprise suitable circuitry, logic, and/or code that may be adapted to communicate an output voltage value to the programmable voltage regulator 400.

In operation, the programmable voltage regulator 400 may be programmed to output a certain voltage by the processor 410. The programmable voltage regulator 400 may receive the input voltage, Vdd, and may generate an output voltage, Vdd_1. However, the voltage generated by the programmable voltage regulator 400, Vdd_1, may have noise components because of other circuitry and/or signal paths that may generate and/or conduct signals. The noise components on the voltage, Vdd_1, may impart undesired noise components to the output of the oscillator circuit 300. Since the oscillator circuit 300 may generate a signal, for example, the signal, Osc_Out, that may be utilized by many analog and/or digital circuitry, it may be desirable to remove the noise components from the voltage, Vdd_1, to the oscillator circuit 300.

A resistor-capacitor (RC) circuit comprising the resistor 402 and the capacitor 404 may remove some of the unwanted noise components in the voltage, Vdd_1. The RC circuit comprising the resistor 402 and the capacitor 404 may be a low pass filter. The resistance value of the resistor 402 and the capacitance value of the capacitor 404 may be appropriately chosen to filter the undesired noise. The filtered voltage, Vdd_osc, may be communicated to the oscillator circuit 300. The resistance value for the resistor 402 may be chosen so that a voltage drop across the resistor 402 may not reduce the voltage, Vdd_osc, too much. The supply voltage for various electronic circuitry, including the oscillator circuit 300, may have specifications that need to be met. In order to compensate for the voltage drop across the resistor 402, the processor 410 may indicate that a higher output voltage be generated by the programmable voltage regulator 400.

The voltage drop across the resistor 402 may depend on the current drawn by the oscillator circuit 300 and the resistance of the resistor 402. Therefore, the voltage drop across the resistor 402 may be determined during a design cycle for an implementation of an embodiment of the invention. The processor 410 may communicate to the voltage regulator 400 a value that may be utilized by the voltage regulator 400 to output correct voltage. The value communicated may be, for example, a fixed number assigned to a global variable. Although this embodiment of the invention may utilize a processor, for example, the processor 410, to indicate to the programmable voltage regulator 400 the desired output voltage, the invention need not be so limited. For example, the voltage regulator may be hardwired on the circuit board to output a specific voltage.

The low pass filter formed by the resistor 402 and the capacitor 404 may have a cutoff frequency, $f_c$, that may be determined by the values of the resistor 402 and the capacitor 404 as follows $f_c = 1/(6.28\ t)$, where t may be defined as $t = R*C$.

The R may be the resistance of the resistor 402, and the C may be the capacitance of the capacitor 404. The cutoff frequency may be defined as the frequency where the output of the low pass filter is attenuated by 3 dB with respect to the input of the low pass filter.

Figure 5:
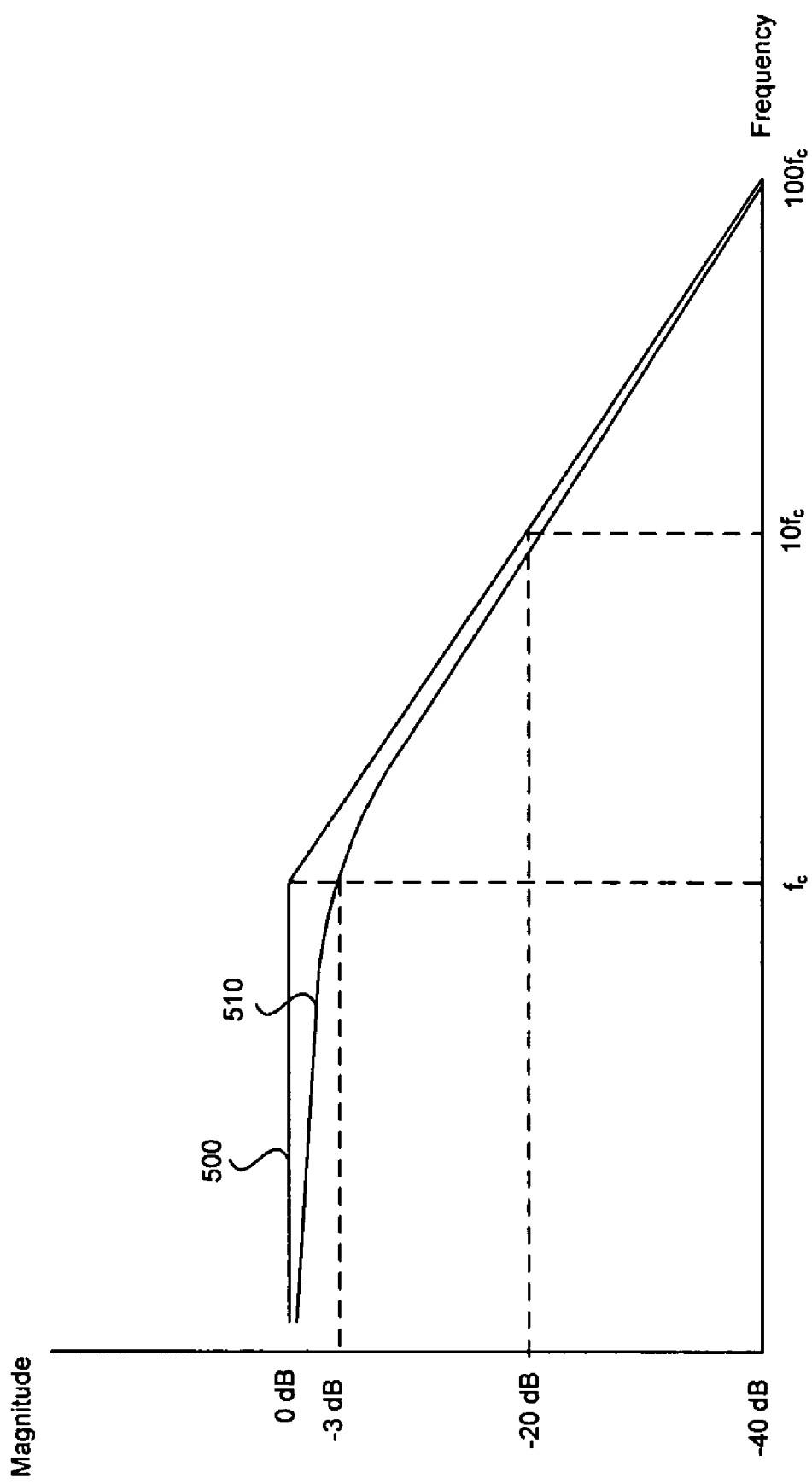
FIG. 5 is a graph illustrating frequency response of an exemplary noise filter, in accordance with an embodiment of the invention.

FIG. 5 is a graph illustrating frequency response of an exemplary noise filter, in accordance with an embodiment of the invention. Referring to FIG. 5, there is shown an idealized plot 500 and a non-idealized plot 510 of strength of a signal, for example the supply voltage, Vdd_osc, versus the frequency of that signal, for a low pass filter formed by the resistor 402 (FIG. 4) and the capacitor 404 (FIG. 4). The idealized plot 500 may be the limits of the non-idealized plot 510. The strength of the output signal is indicated in decibels (dB) and the frequency of the signal is in units of $f_c$, where $f_c$ may be a cutoff frequency of the low pass filter. The cutoff frequency may be defined as the frequency at which an idealized low pass filter starts to attenuate an input signal. This may be the same frequency in the plot 510 where there is an attenuation of 3 dB for the output signal with respect to the input signal.

For the idealized plot 500, the strength of the output signal of the low pass filter may remain constant at zero dB from a frequency of zero Hertz to the cutoff frequency, $f_c$. After the cutoff frequency, $f_c$, the strength of the output signal may decrease by 20 dB per increase by a decade of frequency with respect to the input signal strength. A decade indicates a factor of 10. For example, at the cutoff frequency of $f_c$ the output signal strength may be 0 dB, but at the frequency of 10 $f_c$, the output signal strength may be −20 dB. The non-idealized plot 510 may show attenuation of the output signal, with respect to the input signal, even below the cutoff frequency $f_c$. At the cutoff frequency $f_c$, the attenuation of the output signal, with respect to the input signal, may be 20 dB. Then, similarly to the idealized plot 500, there may be a 20 dB loss for each decade increase in frequency.

A decibel is a unit of comparison between two values and may be defined for voltage as:

$dB = 20\ log_{10}(V_{out}/V_{in})$.

The $V_{out}$ may be an output signal of a device, for example, the output voltage of the low pass filter described in FIG. 4, and $V_{in}$ may be an input signal to the device, for example, the input voltage to the low pass filter described in FIG. 4.

Therefore, the idealized plot 500 may show a zero dB loss in strengths of the output signal with respect to the input signal up to the cutoff frequency of $f_c$. However, there may be a 20 dB signal strength loss from the cutoff frequency $f_c$ to 10 $f_c$. Furthermore, there may be another 20 dB loss in output signal strength with respect to the input signal strength from the frequency 10 $f_c$ to the frequency 100 $f_c$.

Figure 6:
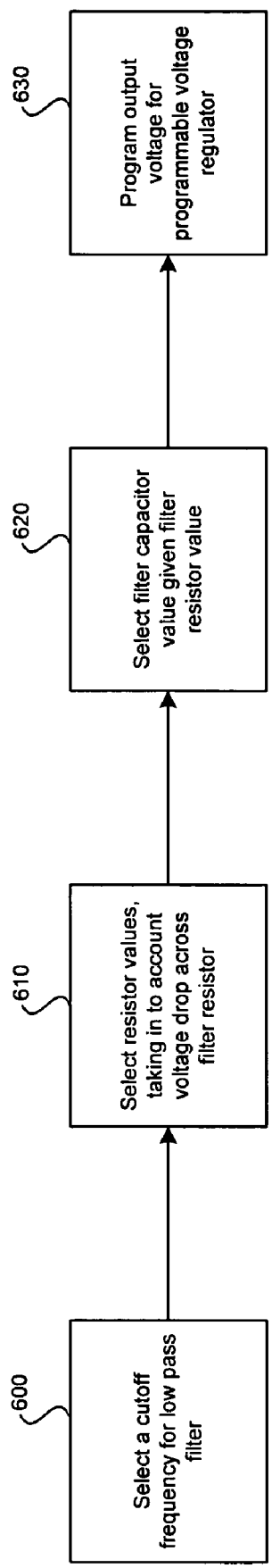
FIG. 6 is an exemplary flow diagram for implementing a noise filter, in accordance with an embodiment of the invention.

FIG. 6 is an exemplary flow diagram for implementing a noise filter, in accordance with an embodiment of the invention. Referring to FIG. 6, step 600 comprises selecting a suitable cutoff frequency for the low pass filter. Step 610 may comprise selecting a suitable resistor value for the low pass filter given the cutoff frequency, while taking in to account the voltage drop across the resistor. Step 620 may comprise selecting the appropriate capacitor value for the low pass filter given the cutoff frequency and the resistor value. Step 630 may comprise indicating to the programmable voltage regulator 400 the appropriate voltage to output.

Referring to FIGS. 4 and 6, the steps 600 to 630 may be utilized to implement a low pass filter that may filter out high frequency noise at the supply voltage of an oscillator circuit 300. In step 600, a cutoff frequency may be chosen. The cutoff frequency may depend on several factors such as, for example, which noise components may need to be reduced, the frequencies of those noise components, and the amount of attenuation desired. For example, assume there is a noise component at 1 megahertz, and its signal strength may need to be reduced by 60 dB in order to keep it from generating noise at the output of the oscillator circuit 300 (FIG. 4). Then, the maximum cutoff frequency may be around 1 kilohertz since this may be 3 decades away from 1 megahertz. Three decades of frequency may be equivalent to 60 dB attenuation with the RC low pass filter described in FIG. 4. Reducing the cutoff frequency by another decade to 100 hertz may attenuate the 1 megahertz noise by another 20 dB. However, this may cause problems because the capacitor and/or resistor values may be too large. For this example, the cutoff frequency may be assumed to be 1 kilohertz.

In step 610, the resistor value may be chosen for the low pass filter, keeping in mind the cutoff frequency of 1 kilohertz and the desire not to drop too much voltage across the low pass filter resistor. For example, if the oscillator circuit 300 requires a current of 4 milliamps (mA), and a maximum voltage that may be dropped across the resistor 402 is determined to be 200 mV, then the resistor value may be fixed at 50 ohms. The maximum voltage that may be dropped across the resistor 402 may be design dependent.

In step 620, an appropriate capacitor value may be chosen for the capacitor 404, given the resistor value for the resistor 402. By utilizing the formula for the cutoff frequency, the capacitance value of the capacitor 404 may be determined:

$$f_c = 1000 \, Hz = 1/(6.28 * R * C)$$

$$= 1/(6.28 * 50 * C),$$

$$C = 1/(6.28 * 50 * 1000) = 3.2 \times 10^{-6} \text{ Farads.}$$

Therefore, a standard capacitance value of 3.3 microFarads may be chosen for the capacitor 404 in order to have a cutoff frequency of 1 kilohertz.

In step 630, the processor 410 may program the programmable voltage regulator 400 with the desired output voltage in order to compensate for the voltage drop across the resistor 402. For example, if the oscillator circuit 300 requires 1.8 volts for the voltage, Vdd_osc, then the programmable voltage regulator 400 may be programmed to output the voltage, Vdd_1, of 2 volts. In this manner, the 200 millivolt drop across the resistor 402 may still leave the supply voltage, Vdd_osc, at 1.8 volts.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for reducing noise in a circuit, the method comprising:
   receiving a first voltage at a positive potential input of an oscillator circuit comprising an oscillator core and a buffer coupled to an output of said oscillator core;
   filtering noise from a second voltage to generate said first voltage using a resistor coupled between said positive potential input of said oscillator circuit and a source of said second voltage, and a capacitor coupled between said positive potential input of said oscillator circuit and a ground of said oscillator circuit; and
   compensating for a voltage drop across said resistor by varying said second voltage.

2. The method according to claim 1, comprising selecting a cutoff frequency for said filtering.

3. The method according to claim 2, comprising selecting a resistance value for said resistor for said selected cutoff frequency.

4. The method according to claim 2, comprising selecting a capacitance value for said capacitor for said selected cutoff frequency.

5. The method according to claim 1, comprising selecting a resistance value for said resistor to maintain at least a minimum voltage for said oscillator circuit.

6. The method according to claim 1, comprising programmably controlling said compensating.

7. The method according to claim 1, comprising limiting said second voltage so that said first voltage does not exceed a maximum voltage requirement for said oscillator circuit.

8. The method according to claim 1, wherein said filtering is done via a low pass filter, comprising at least said resistor and said capacitor.

9. The method according to claim 8, wherein said low pass filter has a cutoff frequency of about one kilohertz.

10. A system for reducing noise in a circuit, the system comprising:
    an oscillator circuit that receives a first voltage at a positive potential input, wherein said oscillator circuit comprises an oscillator core and a buffer coupled to an output of said oscillator core;
    circuitry that filters noise from a second voltage to generate said first voltage, wherein said circuitry comprises a resistor coupled between said positive potential input of said oscillator circuit and a source of said second voltage, and a capacitor coupled between said positive potential input of said oscillator circuit and a ground of said oscillator; and
    circuitry that compensates for a voltage drop across said resistor by varying said second voltage.

11. The system according to claim 10, wherein a cutoff frequency is selected for said circuitry that filters.

12. The system according to claim 11, wherein a resistance value for said resistor is selected for said selected cutoff frequency.

13. The system according to claim 11, wherein a capacitance value for said capacitor is selected for said selected cutoff frequency.

14. The system according to claim 10, wherein a resistance value for said resistor is selected to maintain at least a minimum voltage for said oscillator circuit.

15. The system according to claim 10, comprising circuitry that programmably controls said compensating.

16. The system according to claim 10, wherein said second voltage is limited so that said first voltage does not exceed a maximum voltage requirement for said oscillator circuit.

17. The system according to claim 10, wherein said circuitry that filters is a low pass filter that comprises at least said resistor and said capacitor.

18. The system according to claim 17, wherein said low pass filter has a cutoff frequency of about one kilohertz.

* * * * *